United States Patent
Lee et al.

(10) Patent No.: US 12,266,999 B2
(45) Date of Patent: Apr. 1, 2025

(54) DIGITAL FEEDBACK BASED ADAPTIVE DELAY TIME CONTROL METHOD AND APPARATUS FOR HIGH EFFICIENCY ACTIVE RECTIFIER

(71) Applicant: KOREA UNIVERSITY RESEARCH AND BUSINESS FOUNDATION, Seoul (KR)

(72) Inventors: Hyung Min Lee, Seoul (KR); Ji San Ahn, Seongnam-si (KR)

(73) Assignee: Korea University Research and Business Foundation, Seoul (KR)

( * ) Notice: Subject to any disclaimer, the term of this patent is extended or adjusted under 35 U.S.C. 154(b) by 24 days.

(21) Appl. No.: 18/190,509

(22) Filed: Mar. 27, 2023

(65) Prior Publication Data
US 2023/0353031 A1 Nov. 2, 2023

(30) Foreign Application Priority Data
Apr. 27, 2022 (KR) .......................... 10-2022-0051783

(51) Int. Cl.
*H02M 1/00* (2007.01)
*H02J 50/10* (2016.01)
*H02M 7/219* (2006.01)
*H03K 3/037* (2006.01)
*H03K 5/01* (2006.01)
*H03K 5/00* (2006.01)

(52) U.S. Cl.
CPC ............ *H02M 1/0012* (2021.05); *H02J 50/10* (2016.02); *H02M 7/219* (2013.01); *H03K 3/037* (2013.01); *H03K 5/01* (2013.01); *H03K 2005/00058* (2013.01)

(58) Field of Classification Search
None
See application file for complete search history.

(56) References Cited

U.S. PATENT DOCUMENTS 9,774,274 B2 * 9/2017 Lee ........................ H02M 7/219

* cited by examiner

*Primary Examiner* — Cassandra F Cox
(74) *Attorney, Agent, or Firm* — NSIP Law

(57) ABSTRACT

Disclosed are a method and an apparatus of digital feedback based adaptive delay time control for a high efficiency active rectifier. According to the present invention, provided is an apparatus for digital feedback based adaptive delay time control, which adaptively compensates a driving delay of a switch by controlling a time of a delay circuit through a digital feedback-based compensation technique, and operate the switch at an appropriate timing in spite of changes in operation environments such as an input voltage and a load to increase the efficiency of an AC-DC rectifier.

10 Claims, 8 Drawing Sheets

(a) (b)

DIGITAL FEEDBACK BASED ADAPTIVE DELAY TIME CONTROL METHOD AND APPARATUS FOR HIGH EFFICIENCY ACTIVE RECTIFIER

CROSS-REFERENCE TO RELATED APPLICATION

This application claims under 35 U.S.C. § 119(a) the benefit of Korean Patent Application No. 10-2022-0051783 filed on Apr. 27, 2022, the entire contents of which are incorporated herein by reference.

BACKGROUND

(a) Technical Field

The present invention relates to a method and an apparatus of digital feedback based adaptive delay time control for a high efficiency active rectifier.

(b) Background Art

Wireless Power Transfer (WPT) technology has emerged as a key technology in industrial devices, automobiles, IoT and biomedical fields. In particular, the Implantable Medical Device (IMD) requires continuous power supply to perform a specific function. In the case of the conventional battery-based power supply, there was a fatal disadvantage of requiring periodic replacement due to the limited lifespan of the battery, but it was possible to overcome these disadvantages by continuously supplying power wirelessly by combining WPT technology.

If the energy supply has a physical limit due to a limited operation environment of the system, such as in vivo or toxic environment, the WPT technology for the stable power supply and demand of the system is essential. In addition, as the demand for system ICs that perform multi-functions at low power increases, the requirements for the implementation of low power in the system wireless power management circuit are also increasing, so research on related design technology is being actively conducted.

The efficiency of the wireless power system is typically represented by Power Transfer Efficiency (PTE) and Power Conversion Efficiency (PCE).

The PTE represents power transmission efficiency from a transmitter to a load of a receiver. The PCE represents power conversion efficiency from an input of the receiver to the load.

The WPT technology is mainly used in a limited environment in which energy supply is difficult, and in this case, optimization between transmitter and receiver coils is difficult, which inevitably leads to have a low coil binding coefficient and thus leads to a low PTE. Therefore, it is most important to increase the PCE of the power conversion circuit in order to increase the efficiency of the overall WPT system.

In the WPT system, power conversion circuits having various structures are used. A rectifier that converts AC voltage into DC voltage, and a Low Drop-Out (LDO) Regulator which converts rectified voltage into specific DC voltage having a low ripple required for the load are representative.

In the rectifier of them, two losses are representatively generated. One is a switching loss caused by a parasitic capacitance of a power switch, and as the other one, a $I^2R_{on}$ conduction loss caused when a current flows by a $R_{on}$ resistance of the switch is typical.

Many researches have been conducted circuit-structurally in order to minimize the two losses and increase the PCE.

In terms of a switch structural aspect, a passive diode not requiring a separate driving circuit was initially used. However, there are disadvantages of high $R_{on}$ resistance and large voltage drop, so in recent years, an active diode has been used, which can be fully turned on/off through the separate driving circuit, and can minimize the conduction loss.

In terms of the type of switch, an NMOS can minimize the same $R_{on}$ resistance reference switch size due to a high mobility (electron mobility), and the size of the parasitic capacitance is also decreased to reduce the switching loss. For this reason, Active NMOS is preferred compared to Active PMOS. As a result, an active rectifier having a cross-coupled PMOS structure and an active structure using the active NMOS illustrated in FIG. 1 is primarily used.

Significant power is consumed even for switch driving. A conventional rectifier primarily uses an analog comparator, and most power is used in the analog comparator driving the active NMOS and a controller for implementing various functions. In the case of the WPT, transmission/reception of wireless power is made in a high frequency band, and the switch driving is also made every cycle, so it is most important to lower the power consumption of the switch driving circuit and the controller, which is generated every cycle in order to implement the system with low power and keep a high PCE.

It is important that the switch is turned on and off at an appropriate timing for a high voltage conversion ratio (VCR) and the PCE. The cross-coupled PMOS can be autonomously turned on/off according to a given voltage condition without a separate driving circuit due to positive feedback, and the switching loss is not present, but only the conduction loss is present.

In the case of the active NMOS, both two types of losses are present, and a dominant loss depends on a magnitude of a load current, so optimize of the switch size is required. Further, it is impossible that the active NMOS is autonomously turned on/off, so the active NMOS requires a separate driving circuit and should operate only when an input voltage is lower than a ground voltage.

When a timing when the active NMOS is turned on is delayed, an interval when an input power is not transmitted as an output is generated, and when a time when the active NMOS is turned off is delayed, reverse current flows from the output to the input, which causes efficiency reduction. For this reason, it is necessary to research a driving circuit which can compensate switch driving delay and turn on/off the switch at an appropriate time.

The conventional active rectifier operates the switch as the analog comparator. The input voltage and the ground voltage are compared, and the switch is operated at an interval in which the input voltage is lower than the ground voltage to supply the power to the load. However, a significant parasitic gate capacitance is generated due to a large size of the power switch, and this leads to a propagation delay of a comparator and a buffer illustrated in FIG. 2A. A delay time thereby is influenced even by the input voltage. An interval in which the input power is not transmitted to the output side due to on-delay is generated, and the reverse current flows from the output to the input due to off-delay, so power conversion efficiency is reduced. Circuit technologies for compensating the switch ON/OFF delay have emerged, and there are typically a method for operating the comparator at an earlier timing by intentionally making a predetermined offset by injecting a current into the comparator before ON/OFF and a method for controlling a conduction time by using a delay circuit and analog feedback.

However, technologies conventionally introduced have several disadvantages in order to compensate for the operation delay of the comparator. First, a switch parasitic capacitance magnitude and a delay level by a process variable are unpredictable. Therefore, in the case of a current injection scheme, a size of an offset required for driving delay compensation is unpredictable, so there is a hassle of controlling the amount of the current injected from the outside. Further, power injection of the comparator for operating the switch at an early timing should also be made every cycle, so the power consumption is significant. Moreover, when the amount or the timing of the current injection of the comparator are inappropriate, a problem of multiple pulsing (a phenomenon in which the switch is turned on/off several times within one cycle) illustrated in FIG. 2B is shown, so an additional technology for preventing the problem is required.

A technology is developed, which can adaptively control the amount of the current injected into the comparator and autonomously compensate for the switch operation delay without a need for external control by using a sampling circuit and operational transconductance amplifier (OTA) based analog feedback technique. However, there is a disadvantage in that a feedback speed is limited by an OTA, and the power is additionally consumed in a control circuit for feedback.

SUMMARY OF THE DISCLOSURE

In order to solve the problem in the related art, the present invention has been made in an effort to provide a method and an apparatus for digital feedback based adaptive delay time control, which adaptively compensates a driving delay of a switch by controlling a time of a delay circuit through a digital feedback-based compensation technique, and operate the switch at an appropriate timing in spite of changes in operation environments such as an input voltage and a load to increase the efficiency of an AC-DC rectifier.

In order to achieve the object, according to an exemplary embodiment of the present invention, provided is an apparatus of digital feedback based adaptive delay time control for a high efficiency active rectifier, which includes: a switch for wireless power transmission; an SR-latch being applied with SET and RESET signals at an on/off timing of the switch and driving the switch; a digital feedback-based compensator comparing magnitudes of an input AC voltage and a ground voltage at the on/off timing of the switch, and outputting a digital modulation value according to the magnitude difference; a coarse delay line receiving an initial pulse according to the input AC voltage, and outputting a first pulse delayed by increasing a delay of the initial pulse in units of a first delay according to the digital modulation value; a fine delay line finely adjusting the delay of the first pulse in units of a second delay smaller than the first delay unit when there is a time at which the input AC voltage is equal to the ground voltage by the coarse delay line; a mode controller determining an operation time of the switch by controlling the fine delay line to consecutively adjust the delay of the first pulse; and a pulse selector selecting a pulse at the operation time of the switch and inputting the selected pulse into the SR-latch.

The switch may be a multi-switch array of which size is controllable according to a load change.

The initial pulse may be generated by passing the input AC voltage through an inverter.

The digital feedback compensator may include a sampling circuit sampling the input AC voltage, a digital comparator comparing the input AC voltage and the ground voltage, and a bidirectional counter outputting an up/down counting value according to the magnitude difference between the input AC voltage and the ground voltage.

The coarse delay line may include a plurality of inverters, capacitors, and logical operation circuits, and control the number of the capacitors according to the up/down counting value and increase the delay of the initial pulse.

When there is the time when the input AC voltage is equal to the ground voltage by the coarse delay line, the mode controller may execute Mode 1 to digitally feed back the first pulse to be adjusted rapidly and slowly repeatedly by the second delay unit, and execute Mode 2 after the adjustment is repeated at a predetermined number of times to determine the operation time of the switch.

The mode controller may switch the digital feedback-based compensator to a standby mode when executing Mode 2 above.

After executing Mode 2 above, the mode controller may periodically switch Mode 2 above into Mode 1 above to determine the operation time of the switch again.

The mode controller may include a feedback detector that records the digital feedback operation in Mode 1 above, and determines whether to switch Mode 1 above into Mode 2 above.

According to another exemplary of the present invention, provided is a method of digital feedback based adaptive delay time control for a high efficiency active rectifier, which includes: comparing, by a digital feedback based compensator, magnitudes of an input AC voltage and a ground voltage at the on/off timing of the switch for wireless power transmission, and outputting a digital modulation value according to the magnitude difference; receiving, by a coarse delay line, an initial pulse according to the input AC voltage, and outputting a first pulse by increasing a delay of the initial pulse in units of a first delay according to the digital modulation value; finely adjusting, by a fine delay line, the delay of the first pulse in units of a second delay smaller than the first delay unit when there is a time at which the input AC voltage is equal to the ground voltage by the coarse delay line; determining, by a mode controller, an operation time of the switch by controlling the fine delay line to consecutively adjust the delay; and selecting, by a pulse selector, a pulse at the operation time of the switch and being applied with SET and RESET signals at an on/off timing of the switch, and inputting the SET and RESET signals into an Sr-latch for driving the switch.

According to the present invention, all switch driving circuits are designed by a digital scheme and can operate at a low power, and adaptive switch driving delay compensation is possible through a mode controller, so there is no hassle that an operating parameter should be controlled externally, so that the present invention can be applied to an application in which an operation environment is limited.

Further, according to the present invention, since a digital feedback-based switch driving delay compensation algorithm is applied, a bandwidth is not limited, the switch driving delay compensation is possible rapidly as compared with the conventional technology, and as a result, the present invention can be applied to an application in which fluctuation of the input voltage continuously occurs.

DETAILED DESCRIPTION

Figure 1:
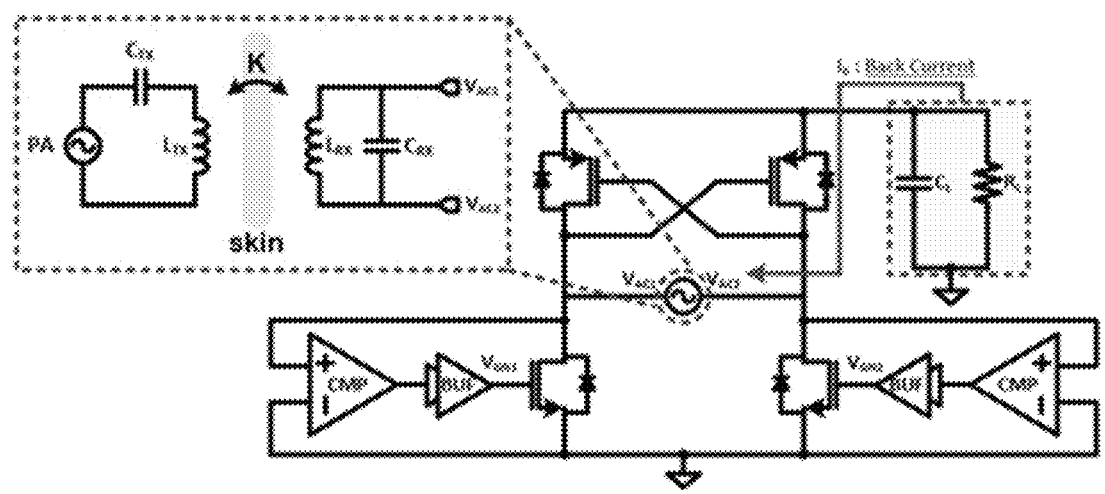
FIG. 1 is a diagram illustrating active rectifiers having a cross-coupled PMOS structure and an active structure using an active NMOS.
Figure 2:
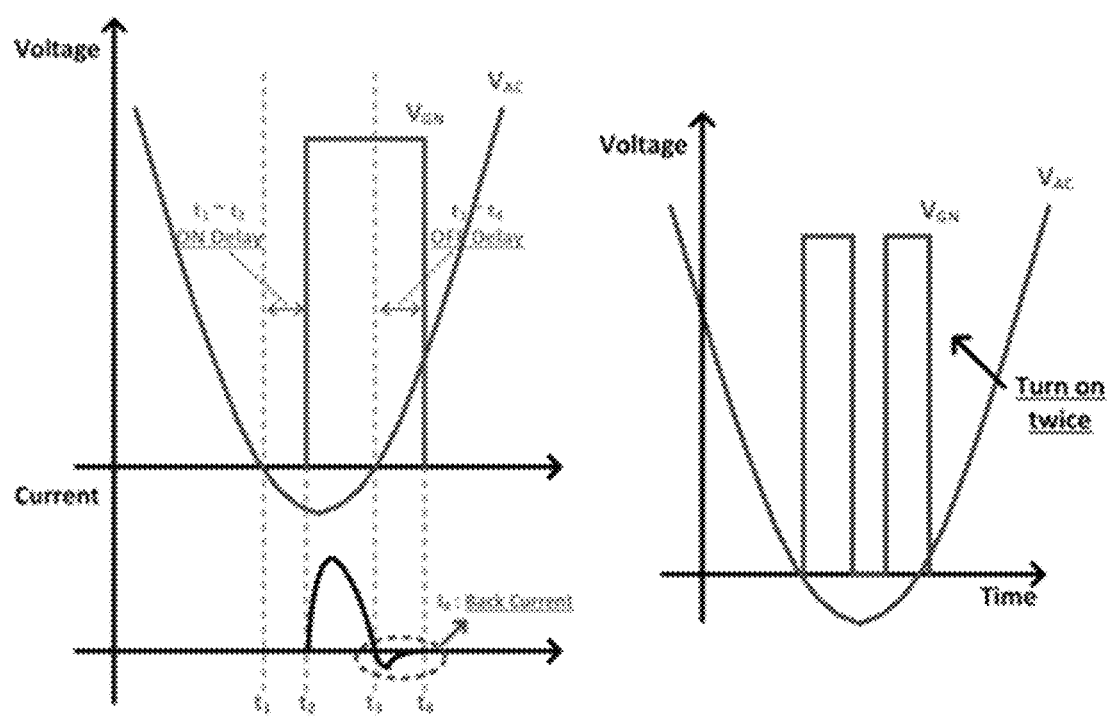
FIG. 2 is a diagram illustrating propagation delay and multiple pulsing of a comparator and a buffer according to the related art.

The present invention may make various modifications and have various exemplary embodiments, and thus specific exemplary embodiments will be illustrated in the drawings and described in detail.

However, this is not intended to limit the present invention to specific exemplary embodiments, and it should be understood that the present invention covers all the modifications, equivalents and replacements included within the idea and technical scope of the present invention.

The exemplary embodiment is to provide a digital switch driving circuit capable of autonomous adaptive switch ON/OFF driving delay compensation in a circuit without a problem of multiple pulsing away from conventional analog comparator based switch driving.

The driving circuit according to the exemplary embodiment drives the switch by a scheme of applying SET (ON, rising edge) and RESET (OFF, falling edge) signals at an appropriate ON/OFF timing after passing through a 2-stage delay circuit, a coarse delay line (a circuit having a long delay level) and a fine delay line (a circuit having a short delay level), in which an initial pulse generated by a simple clock generator is adaptively controlled by digital feedback.

Here, the coarse delay line may be a circuit in which 1 LSB Δt as a delay unit is large, and the fine delay line may be defined as a circuit in which 1 LSB Δt is small.

In the case of an SR-latch used for switch driving, there is a characteristic that an abnormal output Q in which a pulse signal is not applied to SET and RESET inputs at the ON/OFF timing of the switch is maintained, and input voltage and ground voltage do not influence an output of the SR-latch, and as a result, it is possible to prevent a multiple pulsing phenomenon.

Additionally, a digital circuit according to the exemplary embodiment has a characteristic that static current is little consumed, and most power consumption is made at dynamic current.

Two digital comparators are required per one switch for the digital feedback based delay compensation proposed by the exemplary embodiment. In this case, a digital comparator is characterized in that the digital comparator is not limited by a bandwidth, so a feedback speed is faster than the conventional analog scheme, and since the digital comparator operates by applying a clock only when necessary, power consumption is small to implement a digital feedback algorithm at low power.

Since the switch driving delay is compensated through digital feedback, and information required for driving is digitally modulated and stored after searching an optimal ON/OFF time, it is not necessary to continuously perform an algorithm, so digital circuits are made to enter a standby mode, thereby reducing the power consumption. Finally, the exemplary embodiment is to provide an AC-DC rectifier which can operate with high efficiency in spite of a change in operation environment by reducing the power consumption and adaptively compensating the switch driving delay by implementing all circuits required for the switch driving in a digital scheme.

Hereinafter, the AC-DC rectifier according to the exemplary embodiment will be described in detail with reference to the drawing.

Figure 3:
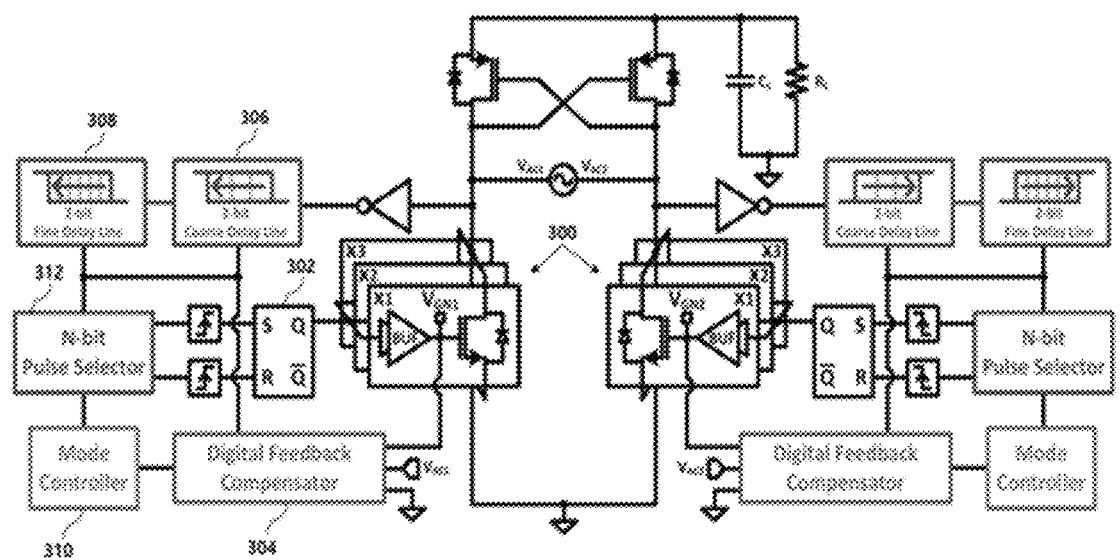
FIG. 3 is a diagram illustrating an AC-DC rectifier adopting a digital feedback-based switch driving circuit according to one preferred embodiment of the present invention.

FIG. 3 is a diagram illustrating an AC-DC rectifier adopting a digital feedback-based switch driving circuit according to an exemplary embodiment of the present invention.

Referring to FIG. 3, the AC-DC rectifier according to the exemplary embodiment may include a switch 300, an Sr-latch 302, a digital feedback-based compensator 304, a coarse delay circuit 306, a fine delay circuit 308, a mode controller 310, and a pulse selector 312.

The switch 300 of the rectifier according to the exemplary embodiment as a switch turned on/off for wireless power transmission can operate with loss optimization and high efficiency through control of a switch size according to a load change by applying a multi-switch array. When the switch size is changed, the gate parasitic capacitance is also changed, so a driving delay level is changed, but in the exemplary embodiment, one digital switch driving circuit is designed to be commonly applied to all multi-switch arrays, and thus adaptive delay compensation is possible in spite of the change in switch size.

The SR-latch 302 drives the switch 300 by being applied with the SET and RESET signals at the on/off timing of the switch 300.

A pulse determined by adjusting the delay of the initial pulse in the coarse delay line 306 and the fine delay line 308 through digital feedback-based compensator 304 is input into the SR-latch 302 according to the exemplary embodiment.

The digital feedback-based compensator 304 compares magnitudes of the AC voltage and the ground voltage at the on/off timing of the switch 300 to output a digital modulation value according to a difference in magnitude of the voltage.

Thereafter, the coarse delay line 306 receives the initial pulse according to the input AC voltage, and outputs a first pulse delayed by increasing the delay of the initial pulse in units of a first delay according to the digital modulation value.

Further, the fine delay line 308 finely adjusts the delay of the first pulse in units of a second delay smaller than the first delay unit when there is a time at which the input AC voltage is equal to the ground voltage by the coarse delay line 306.

The mode controller 310 controls the fine delay line 308 to consecutively adjust the delay of the first pulse to determine an operation time of the switch 300, and the pulse selector 312 selects the pulse at the operation time of the switch to input the selected pulse into the SR-latch 302.

Figure 4:
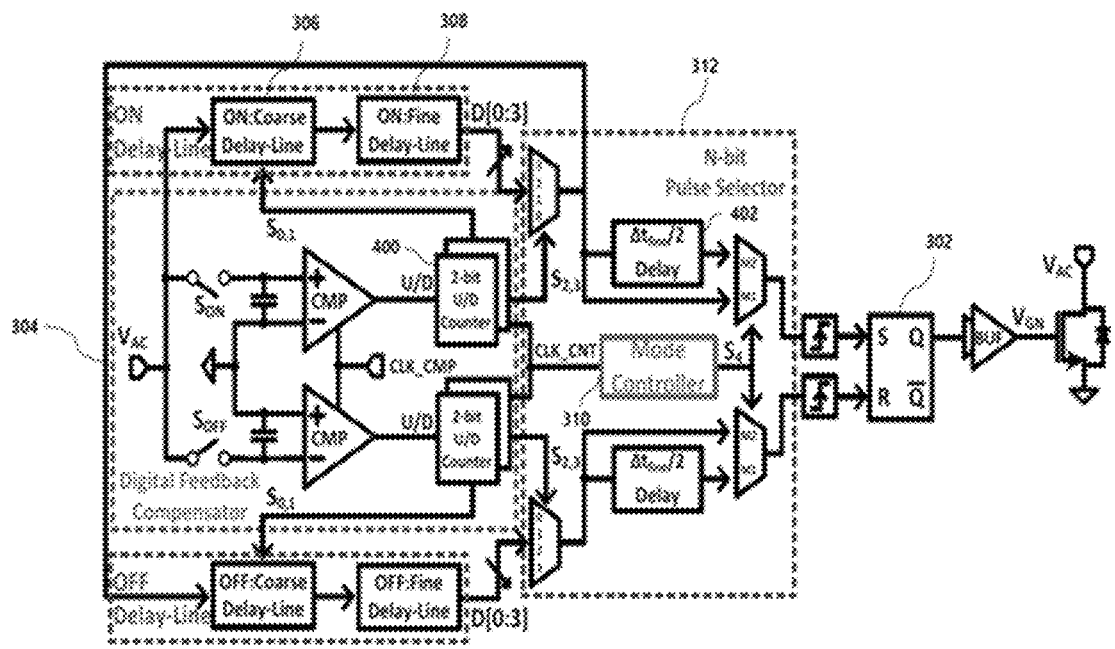
FIG. 4 is a diagram illustrating detailed configurations of a pulse selector and a digital feedback-based compensator according to the exemplary embodiment.
Figure 5:
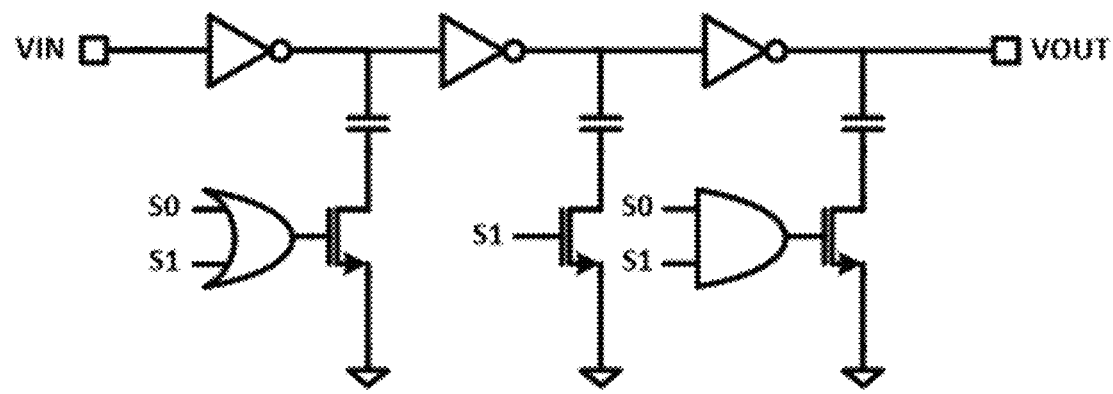
FIGS. 5 and 6 are diagrams illustrating detailed configurations of a coarse delay line and a fine delay line.
Figure 6:
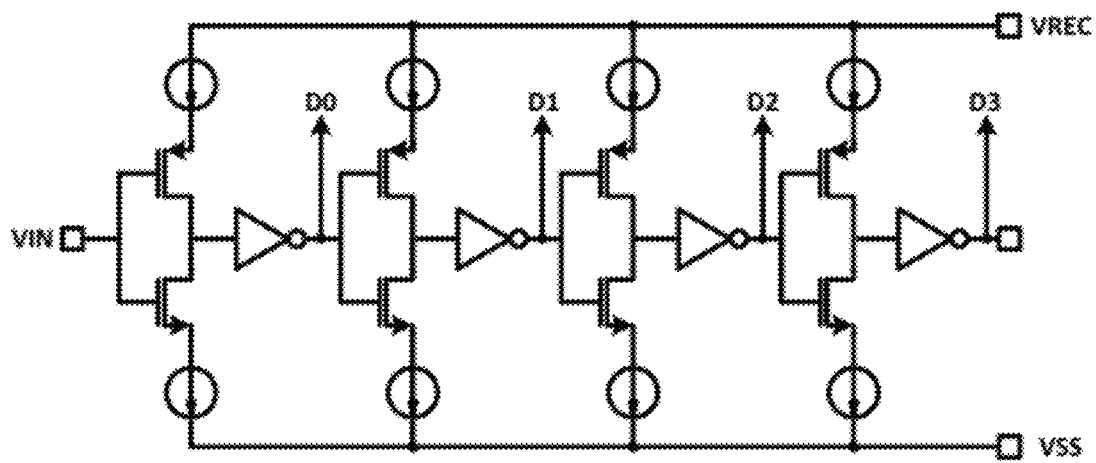

FIG. 4 is a diagram illustrating detailed configurations of a pulse selector and a digital feedback-based compensator according to the exemplary embodiment, and FIGS. 5 and 6 are diagrams illustrating detailed configurations of a coarse delay line and a fine delay line.

Referring to FIG. 4, an input AC signal (input voltage, $V_{AC}$) generates the initial pulse via one inverter.

Thereafter, the initial pulse drives the switch 300 by a scheme of applying the SET/RESET pulse to the SR-latch 302 via two types of 2-bit delay circuits illustrated in FIGS. 5 and 6, which are adaptively controlled by the digital feedback-based compensator 304, i.e., the coarse delay circuit 306 and the fine delay circuit 308.

More specifically, when the switch driving delay compensation algorithm through the digital feedback is described, the initial pulse generated through the inverter passes through a two-stage delay circuit, and first, the delay of the delay line 306 is adaptively controlled so that VAC=VSS time which is an optimal time of the switch operation is included in the fine delay line 308.

As illustrated in FIG. 5, the coarse delay line 306 includes a plurality of inverters, capacitors, and logical operation circuits, and for example, when the VAC=VSS time does not enter the fine delay line, the delay is increased by increasing the number of capacitors between the inverters constituting the coarse delay line 306 through a U/D counter (a bidirectional counter 400) outputting the digital modulation value according to the difference between the magnitudes of the input AC voltage and the ground voltage.

The operation is repeated until the VAC=VSS time enters the fine delay line 308.

Figure 7:
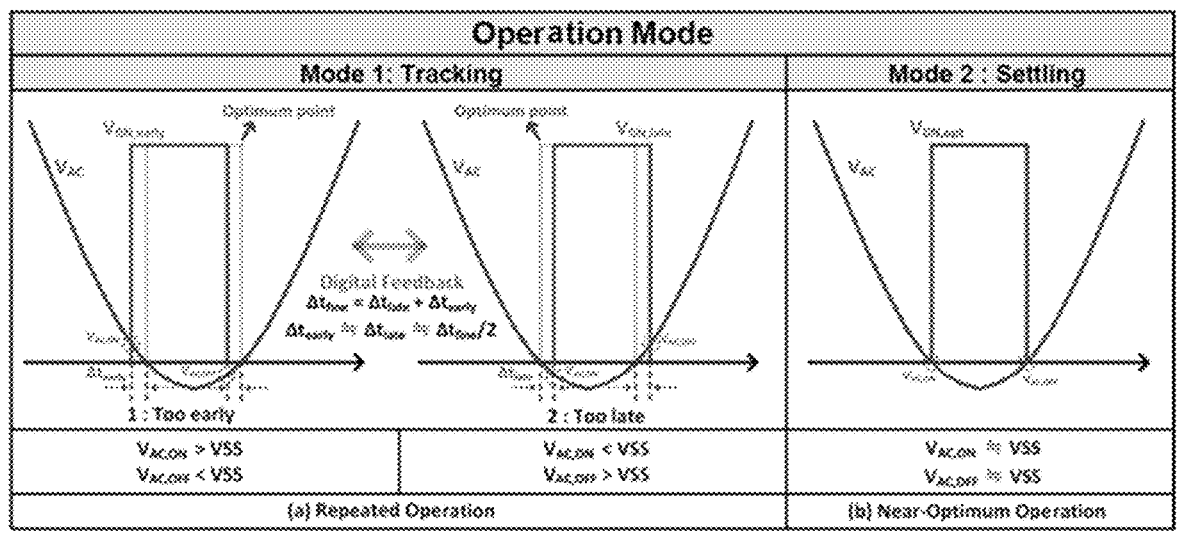
FIG. 7 is a diagram illustrating a digital feedback operation mode according to the exemplary embodiment.

FIG. 7 is a diagram illustrating a digital feedback operation mode according to the exemplary embodiment.

Finally, when the VAC=VSS time enters the fine delay line 308, a digital feedback operation such as Mode 1 of FIG. 7 is automatically performed to find an optimal switch operation time.

Mode 1 of FIG. 7 is a mode of finding the optimal time (VAC=VSS) of the power switch driving through the digital feedback.

The digital feedback-based compensator includes a sampling circuit and a digital comparator, and the sampling circuit constituted by a switch ($S_{ON}/S_{OFF}$) and a capacitor samples $V_{AC,ON}$ and $V_{AC,OFF}$ (input AC voltages at the time of switch ON/OFF) at an ON/OFF time, and the digital comparator (CMP) compares a sampled input voltage with the ground voltage.

When an algorithm of searching the optimal ON time in Mode 1 is described, if $V_{AC,ON}$ (the voltage $V_{AC}$ at the ON time) is higher than VSS, this case means that the switch driving is earlier than the optimal time, so the switch operation is delayed by $\Delta t_{fine}$ which is the unit delay of the fine delay line through the digital feedback. The operation delayed by $\Delta t_{fine}$ is reflected on a switch operation of a next cycle. After the ON operation is delayed by $\Delta t_{fine}$, $V_{AC,ON}$ becomes lower than the VSS which is the ground voltage. Since this means that the switch driving is later than the optimal time again, the switch operation is advanced by $\Delta t_{fine}$ which is the unit delay of the fine delay line through the digital feedback. An algorithm of finding an optimal OFF time is also performed while comparing $V_{AC,OFF}$ (a voltage $V_{AC}$ at the OFF time) with the voltage VSS similarly to the process of finding the ON time.

When early switch driving and late switch driving are repeated with an optimal switch operation time as a boundary, that is, an operation in which the digital feedback is repeated is recorded in a 4-bit shift register (digit shift register) of the mode controller 310 as information of 0 and 1 so that the first pulse output from the coarse delay line 306 is repeatedly adjusted rapidly and slowly in units of the second delay in the fine delay line 308.

When the digital feedback is repeatedly performed for a predetermined number of times (e.g., 4 times), the mode controller 310 drives the switch 300 in Mode 2 (fixed optimal operation mode) illustrated in FIG. 7B. Here, Mode 2 drives the switch at an appropriate timing in a form illustrated in FIG. 7B via a delay circuit at a level in which an early switch driving pulse of Mode 1 is $\Delta t_{fine}/2$ of the pulse selector 312.

As illustrated in FIG. 4, the pulse selector 312 according to the exemplary embodiment selects a pulse for the optimal operation time of the switch 300 and applies the selected pulse to the SR-latch 302 while including a plurality of MUXs and a predetermined delay circuit 402.

When the switch is driven at the optimal timing in Mode 2 after the compensation of the driving delay is completed, the mode controller 310 automatically enters all digital circuits (digital feedback-based compensators) which are not required other than the switch driving into a standby mode. When the digital circuit operates in the standby mode, a dynamic operation is not performed, so only static power is consumed, thereby significantly reducing total power consumption of the rectifier.

The mode controller according to the exemplary embodiment includes a feedback detector that records the digital feedback operation in Mode 1 and determines whether Mode 1 is switched to Mode 2.

Figure 8:
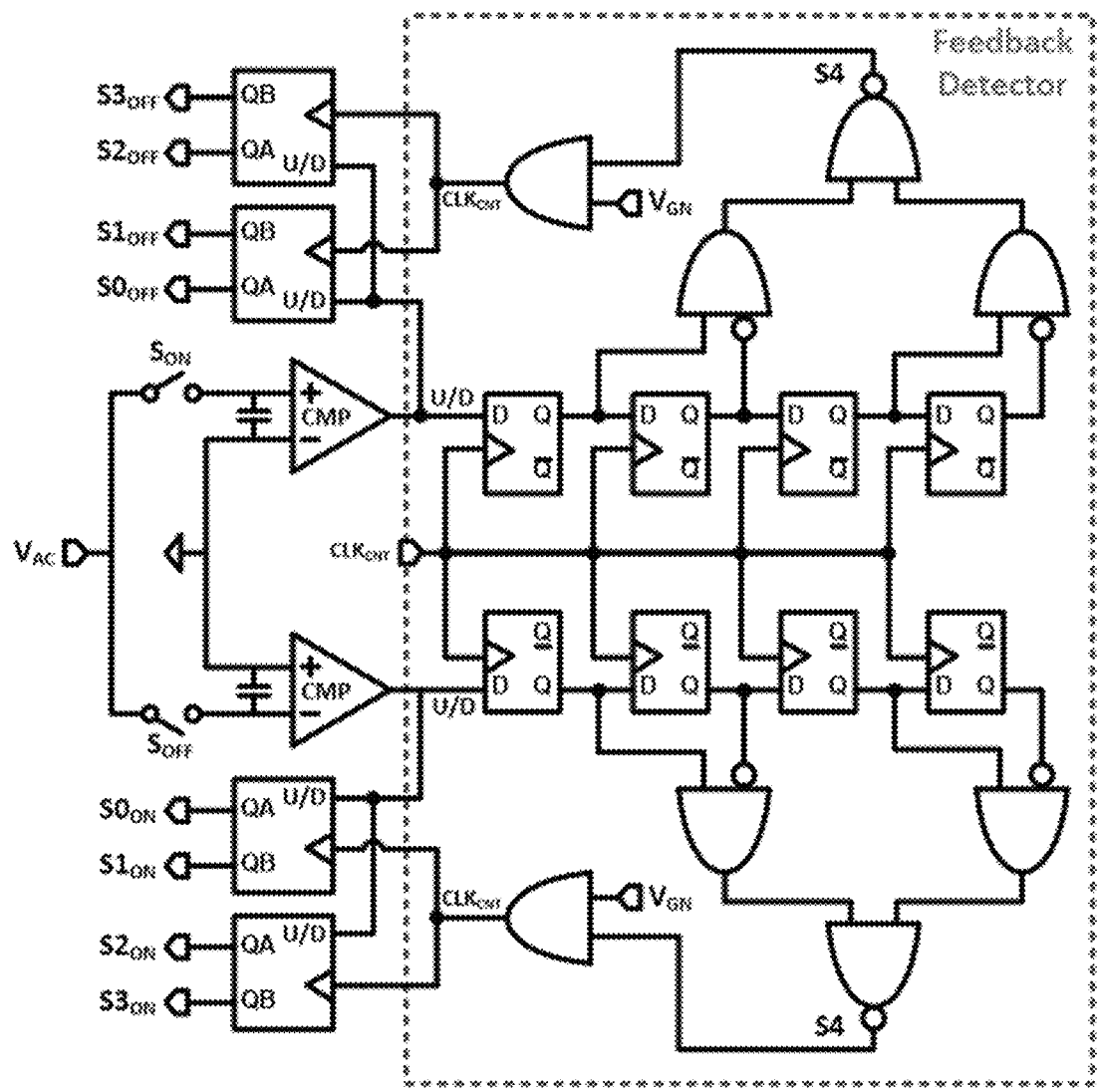
FIG. 8 is a diagram illustrating a detailed configuration of a feedback detector according to the exemplary embodiment.

FIG. 8 is a diagram illustrating a detailed configuration of a feedback detector according to the exemplary embodiment.

The driving delay level of the switch is also influenced by the input voltage. A designed circuit corresponds to fluctuation of the input voltage due to various factors such as changes in angle and spacing distance between coils, and an operation mode is periodically switched to Mode 1 in order to continuously operate the switch at the optimal time to search the optimal switching time.

Consequently, the AC-DC rectifier according to the exemplary embodiment guarantees a high-efficiency operation of the rectifier through the switch size change and the adaptive driving delay compensation even in changes in operation environments such as the load, a coupling state of transmission and reception coils, etc.

Figure 9:
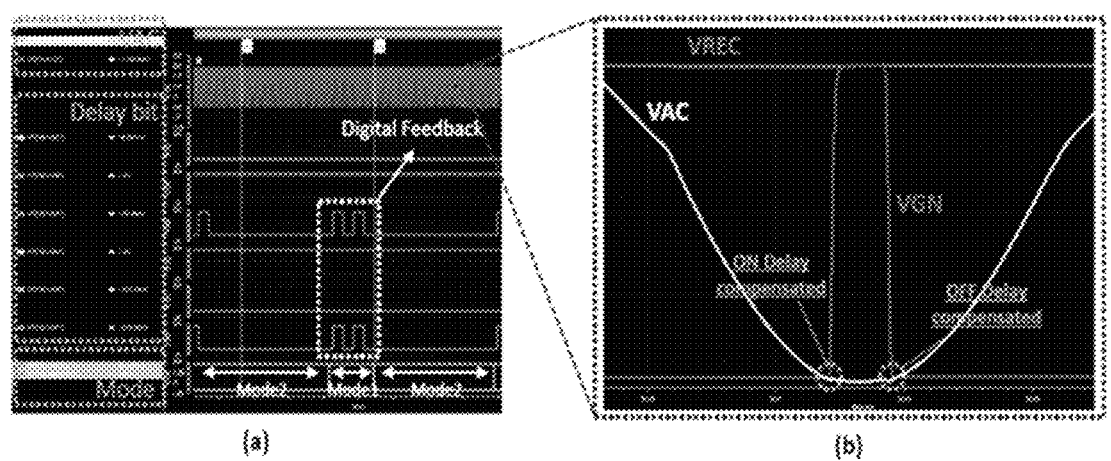
FIGS. 9A and 9B illustrate simulation results of a digital feedback based adaptive delay time control apparatus according to the exemplary embodiment.

FIGS. 9A and 9B illustrate simulation results of a digital feedback based adaptive delay time control apparatus according to the exemplary embodiment.

FIG. 9A illustrates a digital feedback operation waveform and a mode change, and FIG. 9B illustrates an input/output voltage and a gate voltage waveform.

In FIGS. 9A and 9B, it may be identified that $V_{AC,peak}=2V$, VREC=1.9 (VCR=95% @$R_L$=1.62 KΩ), and efficiency is 87.2% in a load of $R_L$=1.62 KΩ, $I_L$=1 mA, and as such, it may be identified that the adaptive driving delay compensation is possible through the digital feedback.

The exemplary embodiment of the present invention is disclosed for an object of the example, and various modifications, changes, and additions can be made within the ideas and scope of the present invention by those skilled in the art, and it should be construed that the modifications, changes and additions belong to the following claims.

What is claimed is:

1. An apparatus of digital feedback based adaptive delay time control for a high efficiency active rectifier, comprising:
 a switch for wireless power transmission;
 an SR-latch being applied with SET and RESET signals at an on/off timing of the switch and driving the switch;
 a digital feedback-based compensator comparing magnitudes of an input AC voltage and a ground voltage at the on/off timing of the switch, and outputting a digital modulation value according to the magnitude difference;
 a coarse delay line receiving an initial pulse according to the input AC voltage, and outputting a first pulse delayed by increasing a delay of the initial pulse in units of a first delay according to the digital modulation value;
 a fine delay line finely adjusting the delay of the first pulse in units of a second delay smaller than the first delay unit when the input AC voltage becomes equal to the ground voltage according to the delay done by the coarse delay line;
 a mode controller determining an operation time of the switch by controlling the fine delay line to consecutively adjust the delay of the first pulse; and
 a pulse selector selecting a pulse at the operation time of the switch and inputting the selected pulse into the SR-latch.

2. The apparatus of digital feedback based adaptive delay time control of claim 1, wherein the switch is a multi-switch array.

3. The apparatus of digital feedback based adaptive delay time control of claim 1, wherein the initial pulse is generated by passing the input AC voltage through an inverter.

4. The apparatus of digital feedback based adaptive delay time control of claim 1, wherein the digital feedback compensator comprises a sampling circuit sampling the input AC voltage, a digital comparator comparing the input AC voltage and the ground voltage, and a bidirectional counter outputting an up/down counting value according to the magnitude difference between the input AC voltage and the ground voltage.

5. The apparatus of digital feedback based adaptive delay time control of claim 4, wherein the coarse delay line comprises a plurality of inverters, capacitors, and logical operation circuits, and controls the number of capacitors according to the up/down counting value and increases the delay of the initial pulse.

6. The apparatus of digital feedback based adaptive delay time control of claim 1, wherein when there is the time when the input AC voltage is equal to the ground voltage by the coarse delay line, the mode controller executes Mode 1 to digitally feed back the first pulse to be adjusted rapidly and slowly repeatedly by the second delay unit, and execute Mode 2 after the adjustment is repeated at a predetermined number of times to determine the operation time of the switch.

7. The apparatus of digital feedback based adaptive delay time control of claim 6, wherein the mode controller switches the digital feedback-based compensator to a standby mode when executing Mode 2 above.

8. The apparatus of digital feedback based adaptive delay time control of claim 6, wherein after executing Mode 2 above, the mode controller periodically switches Mode 2 above into Mode 1 above to determine the operation time of the switch again.

9. The apparatus of digital feedback based adaptive delay time control of claim 6, wherein the mode controller includes a feedback detector that records the digital feedback operation in Mode 1 above, and determines whether to switch Mode 1 above into Mode 2 above.

10. A method of digital feedback based adaptive delay time control for a high efficiency active rectifier, comprising:
 comparing, by a digital feedback-based compensator, magnitudes of an input AC voltage and a ground voltage at the on/off timing of the switch, and outputting a digital modulation value according to the magnitude difference;
 receiving, by a coarse delay line, an initial pulse according to the input AC voltage, and outputting a first pulse by increasing a delay of the initial pulse in units of a first delay according to the digital modulation value;
 finely adjusting, by a fine delay line, the delay of the first pulse in units of a second delay smaller than the first delay unit when there is a time at which the input AC voltage is equal to the ground voltage by the coarse delay line;
 determining, by a mode controller, an operation time of the switch by controlling the fine delay line to consecutively adjust the delay; and
 selecting, by a pulse selector, a pulse at the operation time of the switch and being applied with SET and RESET signals at an on/off timing of the switch, and inputting the SET and RESET signals into an SR-latch for driving the switch.

\* \* \* \* \*